(12) United States Patent
Kazumi et al.

(10) Patent No.: US 6,755,935 B2
(45) Date of Patent: Jun. 29, 2004

(54) PLASMA PROCESSING APPARATUS

(75) Inventors: Hideyuki Kazumi, Hitachinaka (JP);
Ichiro Sasaki, Yokohama (JP); Kenji Maeda, Matsudo (JP); Tsutomu Tetsuka, Chiyoda (JP); Hironobu Kawahara, Kudamatsu (JP)

(73) Assignee: Hitachi, Ltd., Tokyo (JP)

( * ) Notice: Subject to any disclaimer, the term of this patent is extended or adjusted under 35 U.S.C. 154(b) by 10 days.

(21) Appl. No.: 09/793,443

(22) Filed: Feb. 27, 2001

(65) Prior Publication Data

US 2001/0023663 A1 Sep. 27, 2001

(30) Foreign Application Priority Data

Mar. 17, 2000 (JP) .......................... 2000-081735

(51) Int. Cl.⁷ ........................................ H01L 21/3065
(52) U.S. Cl. .............. 156/345.48; 118/723 I; 118/723 AN
(58) Field of Search ............... 118/723 AN, 723 I, 118/723 MA, 723 IR; 156/345.42, 345.46, 345.48, 345.49; 315/111.51; 204/298.06, 298.34

(56) References Cited

U.S. PATENT DOCUMENTS

| | | | |
|---|---|---|---|
| 5,113,790 A | * | 5/1992 | Geisler et al. ............ 118/723 E |
| 5,683,548 A | * | 11/1997 | Hartig et al. ............ 156/345.24 |
| 5,716,451 A | * | 2/1998 | Hama et al. ............... 118/723 I |
| 5,820,947 A | * | 10/1998 | Itoh ............................ 118/50 |
| 5,824,607 A | * | 10/1998 | Trow et al. ................. 438/732 |
| 5,891,252 A | | 4/1999 | Yokogawa et al. |
| 6,028,394 A | * | 2/2000 | Keller et al. ............ 315/111.41 |
| 6,033,481 A | | 3/2000 | Yokogawa et al. |
| 6,155,203 A | * | 12/2000 | Kennedy et al. .......... 118/723 I |
| 6,171,438 B1 | * | 1/2001 | Masuda et al. ........ 156/345.27 |
| 6,180,019 B1 | * | 1/2001 | Kazumi et al. ................ 216/78 |
| 6,251,792 B1 | * | 6/2001 | Collins et al. ............. 438/710 |
| 6,388,624 B1 | * | 5/2002 | Kazumi et al. ............. 343/701 |
| 6,417,111 B2 | * | 7/2002 | Nishikawa et al. ......... 438/710 |

FOREIGN PATENT DOCUMENTS

| | | | | |
|---|---|---|---|---|
| JP | 10-134995 | * | 5/1998 | ............ H05H/1/46 |
| TW | 312815 | | 8/1997 | |

* cited by examiner

Primary Examiner—Gregory Mills
Assistant Examiner—Michelle Crowell
(74) Attorney, Agent, or Firm—Antonelli, Terry, Stout & Kraus, LLP

(57) ABSTRACT

A plasma processing apparatus has a vacuum vessel, a processing chamber arranged in the vacuum vessel and supplied with gas, a support electrode arranged in the processing chamber to support an object to be processed, a radio frequency providing unit for supplying a radio frequency in UHF or VHF band, and a magnetic field generating unit for generating a magnetic field in the processing chamber, wherein the radio frequency providing unit includes an antenna having a groove or step formed in its surface opposing the process object, whereby plasma of high density and high uniformity can be generated in a wide parameter region.

24 Claims, 8 Drawing Sheets

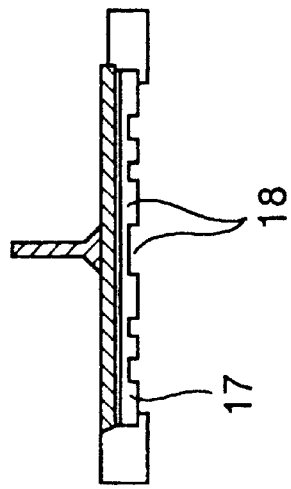
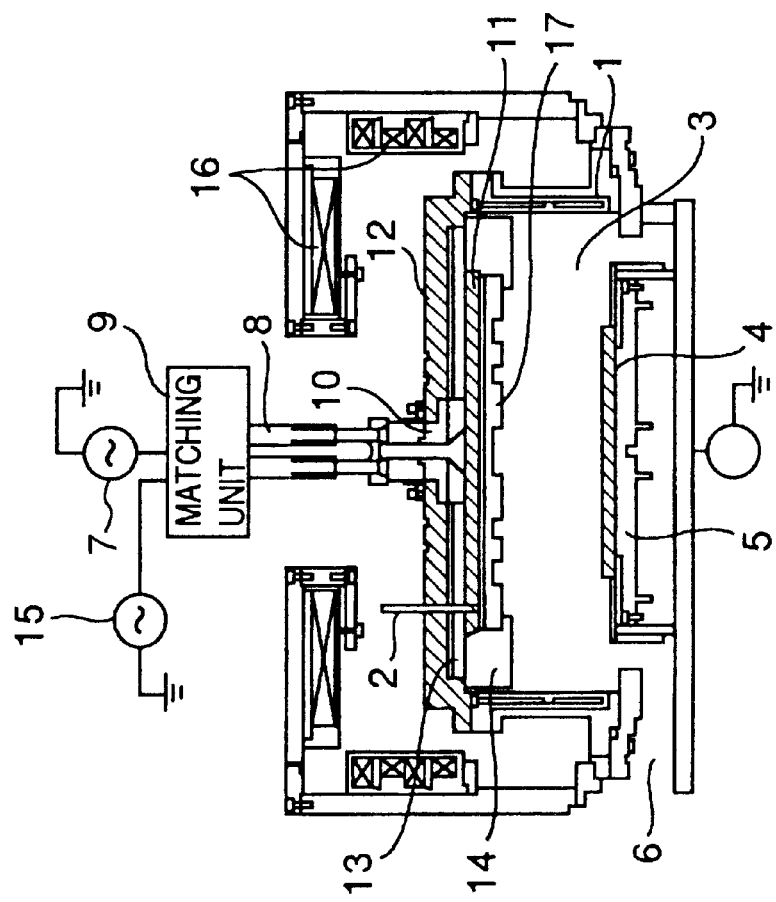

FIG.2A
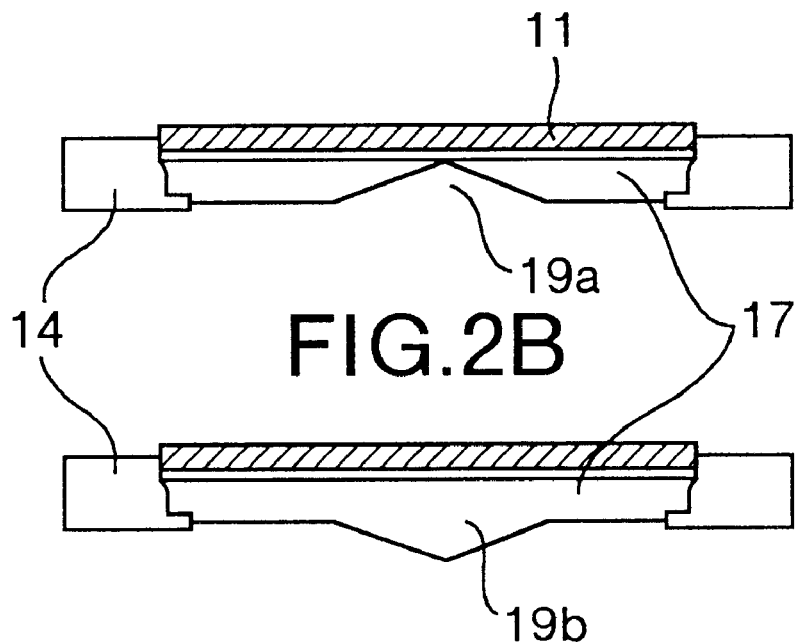
FIG.2B
FIG.3
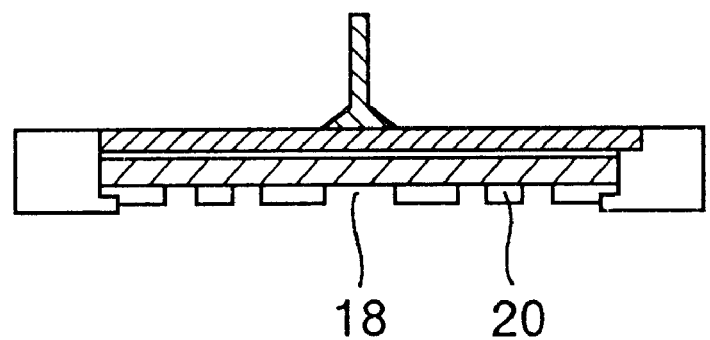

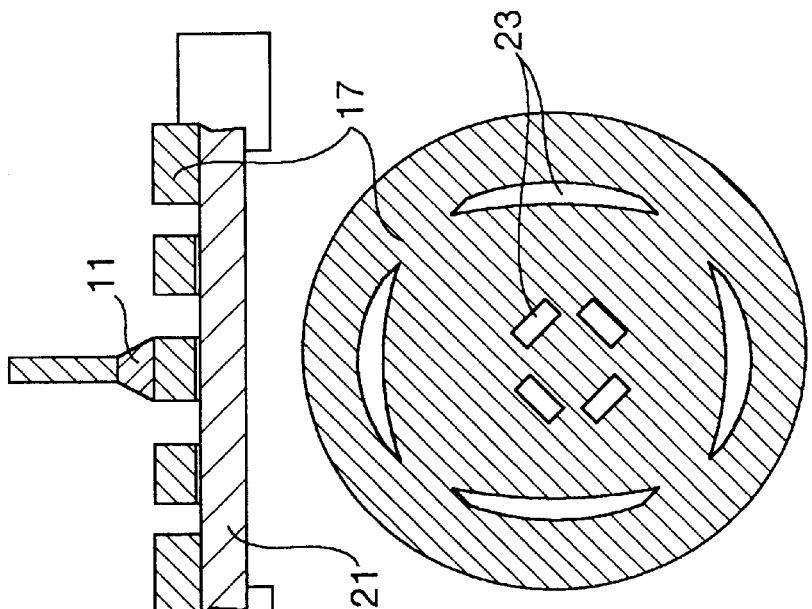
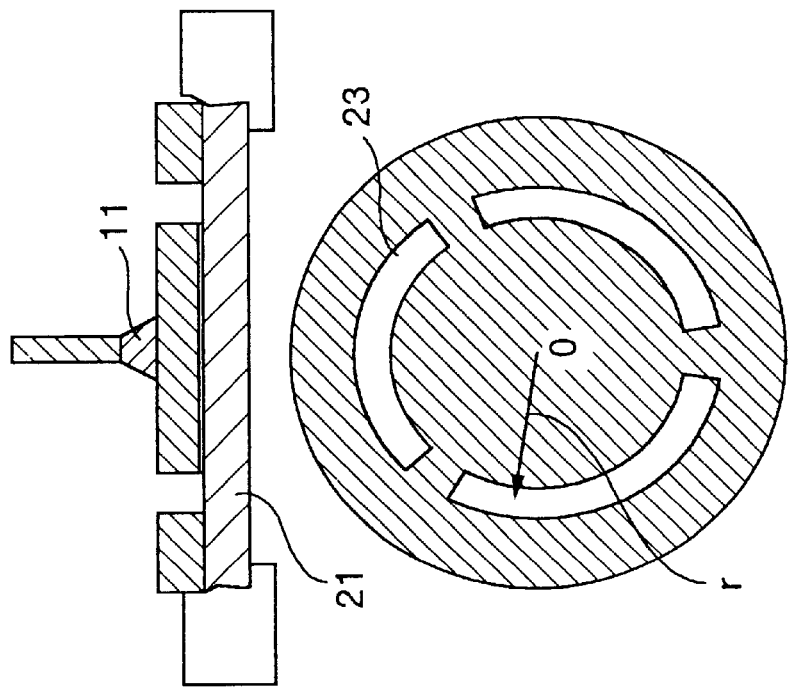

SCHEMATIC DIAGRAM ILLUSTRATIVE OF UHF-ECR

ELECTRIC FIELD INTENSITY AND ELECTRIC FIELD VECTORS DIRECTLY BELOW ANTENNA (WITHOUT STEP)

LINE OF MAGNETIC FORCE OF EXTERNAL MAGNETIC FIELD

EQUI-MAGNETIC FIELD PLANES OF EXTERNAL MAGNETIC FIELD (AT INTERVALS OF 40G)

ELECTRIC FIELD VECTORS DIRECTLY BEROW ANTENNA (WITH STEP)

PLASMA DENSITY DISTRIBUTION ON ELECTRODE

PLASMA PROCESSING APPARATUS

BACKGROUND OF THE INVENTION

The present invention relates to a plasma processing apparatus for processing an object to be processed (process object) by utilizing plasma.

As the degree of integration of semiconductor devices increases, enlargement of the diameter of a wafer representing a process object and fine structuring of circuit patterns have been accelerated. Under the circumstances, in processing a process object by utilizing plasma, for example, a parallel-planar plasma processing apparatus (prior art 1) using a radio frequency (RF) has been used. JP-A-9-27485 (prior art 2) discloses a plasma processing apparatus based on inductive coupling. JP-A-7-307200 discloses a plasma processing apparatus in which a plurality of antennas each having a length equaling ¼ of wavelength of an admitted RF are arranged radially in a plasma generating chamber so as to generate plasma. A similar antenna structure is described in JP-A-9-293682, according to which a plurality of antennas are studded in a plurality of opposing electrodes are arranged in such a way that antennas studded in one electrode group and antennas studded in the other electrode group are parallel thereto and are staggered to provide a comb-shape structure (prior art 3). JP-A-10-134995 describes a parallel-planar UHF plasma apparatus in which a radio frequency in UHF band is supplied to a disk-shaped antenna by means of a coaxial cable, the diameter of the antenna being set to a predetermined value (prior art 4).

SUMMARY OF THE INVENTION

Prior art 1 lacks plasma distribution control means and when the kind of gas and the pressure are changed, distribution of radical compositions and that of reaction products change, making it sometimes difficult to make the processing distribution uniform.

Prior art 2 sometimes has difficulties in establishing compatibility between improvements in selectivity in etching and distribution controllability.

Prior art 3 has sometimes difficulties in making the plasma density uniform in the radial direction.

Prior art 4 has difficulties in adjusting the distribution when gas, pressure or power is changed.

Accordingly, an object of the present invention is to provide a plasma processing apparatus for realizing the generation of plasma suitable for processing in a wide parameter region in a method of generating plasma by using a radio frequency in VHF or UHF band and a magnetic field.

According to one aspect of the invention, a plasma processing apparatus comprises a vacuum vessel, a processing chamber arranged in the vacuum vessel and supplied with gas, a support electrode arranged in the processing chamber to support an object to be processed, radio frequency providing means for supplying a frequency in UHF or VHF band to the processing chamber, and magnetic field forming means for forming a magnetic field in the processing chamber, wherein the radio frequency providing means includes an antenna having a groove or a step (a difference in level) in its surface opposing the process object.

Preferably, the depth or width of the groove or step is thicker than a plasma sheath and is smaller than ¼ of wavelength of the radio frequency. Preferably, the antenna has its surface made of Si or SiC. Preferably, the antenna has a conical recess or boss formed in the center of its surface adjoining plasma. Preferably, the antenna takes a form curved downward concavely or convexly at a constant curvature. Preferably, a planar member made of Si or SiC, or C and being physically or effectively thinner than a skin depth of the radio frequency is arranged on the surface of the antenna. Preferably, a disk-shaped antenna is formed with a slit opening, a planar member made of Si or SiC, or C is arranged on its surface adjoining plasma, the radio frequency is supplied to the processing chamber through the planar member.

In the plasma apparatus comprising the radio frequency providing means for supplying the radio frequency in UHF or VHF band to the disk-shaped antenna and the magnetic field forming means, the recess or boss can be deemed as an uneven portion formed in the surface of disk-shaped antenna adjoining plasma. The uneven portion is sized to such an extent that the plasma can invade a space between the antenna surface and the uneven portion, in other words, the space is sufficiently larger than a plasma sheath, amounting up to at least about 1 mm or more and less than ¼ of wavelength of the radio frequency. Further, the uneven portion is preferably sized to about 1 cm or more. Preferably, the antenna surface is made of Si or SiC.

Other objects, features and advantages of the present invention will be apparent from the following description of the embodiments of the invention taken in conjunction with the accompanying drawings.

BRIEF DESCRIPTION OF THE DRAWINGS

FIGS. 1A and 1B are diagrams showing in sectional form a plasma processing apparatus according to a first embodiment of the invention.

FIGS. 2A and 2B are diagrams showing in sectional form an antenna structure according to a second embodiment of the invention.

FIG. 3 is a diagram showing in sectional form an antenna structure according to a third embodiment of the invention.

FIGS. 6A and 6B are diagrams showing in sectional form an antenna structure according to a sixth embodiment of the invention.

DETAILED DESCRIPTION OF THE EMBODIMENTS

Figure 4A:
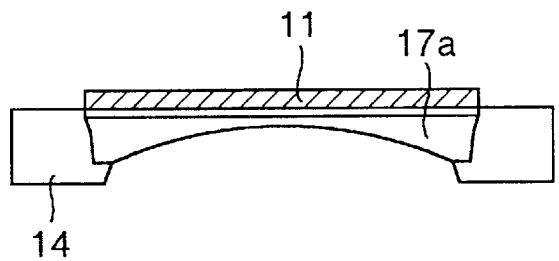
FIGS. 4A and 4B are diagrams showing in sectional form an antenna structure according to a fourth embodiment of the invention.

With the degree of integration of semiconductor devices increased, a wafer representing a process object has been progressively increased in diameter and fine structuring of circuit patterns has been proceeded with. Then, in the insulating film etching for processing oxide films and insulating films of low dielectric constant, there is a growing need for coping with not only the sophisticated device structures and fine structuring of the processing width but also a variety of kinds of processing films, so that high selectivity and vertical process shaping for resist and $Si_3N_4$ are demanded. For example, in the oxide film etching, a fluorocarbon gas containing carbon and fluorine is used and an etching reaction is caused to proceed by irradiating ions on a deposited film of fluorocarbon radical ($C_x F_y$) decomposed by plasma. The film thickness or composition of the fluorocarbon film deposited on oxide film, resist or $Si_3 N_4$ differs case by case and the selectivity develops. It is considered that the higher the density ratio $C_x F_y/F$ between fluorocarbon radical and F radical, the higher the obtainable selectivity becomes. On the other hand, as the amount of $C_x F_y$ or the ratio of carbon increases, the etching reaction sometimes stops. The density of plasma and electron temperature as well as chemical reactions on the chamber wall and recycling dominate the composition of fluorocarbon radical. In addition, reaction products and their dissociative products prevent the etching. Therefore, in the oxide film etching, the density and temperature of plasma dominating the radicals and the dissociation of reaction products are sometimes controlled and for uniform processing of an object of large size, distribution of the plasma density and temperature must be controlled.

For realization of high throughput, that is, high etching rate, it is indispensable to make the plasma density high. Mode for carrying out the invention for this purpose will be described using embodiments and reference examples. In figures, like reference numerals designate like members.

Referring to FIGS. 1A and 1B, there is illustrated a first embodiment of the invention. A plasma processing apparatus comprises a vacuum vessel 1 having a processing chamber 3 to which gas is admitted through a gas inlet system 2 and a support stand (electrode) 5 for supporting an object 4 to be processed. The gas in the processing chamber is evacuated by an evacuation system 6. A radio frequency 8 in UHF or VHF band generated in a UHF or VHF generating source 7 is supplied to a radio frequency electrode 11 by way of matching unit 9 and transmission line 10. A dielectric 13 is filled between the radio frequency electrode 11 and conductor wall 12 and the radio frequency is provided to the processing chamber 3 via radio frequency providing means 14. Independently of the UHF or VHF generating source 7, a RF generating source 15 is provided to supply a radio frequency in RF band to the same radio frequency electrode 11. Magnetic field forming means 16 is disposed around the vacuum vessel 1 to form a magnetic field in the processing chamber 3. A disk-shaped antenna 17 is connected to the radio frequency electrode. An illustration of FIG. 1B shows the neighborhood of disk-shaped antenna 17 excerpted from FIG. 1A for the sake of explaining the disk-shaped antenna 17. The disk-shaped antenna 17 features that a concentric groove (grooves) or step (or steps) 18 is formed in its surface.

Figure 7A:
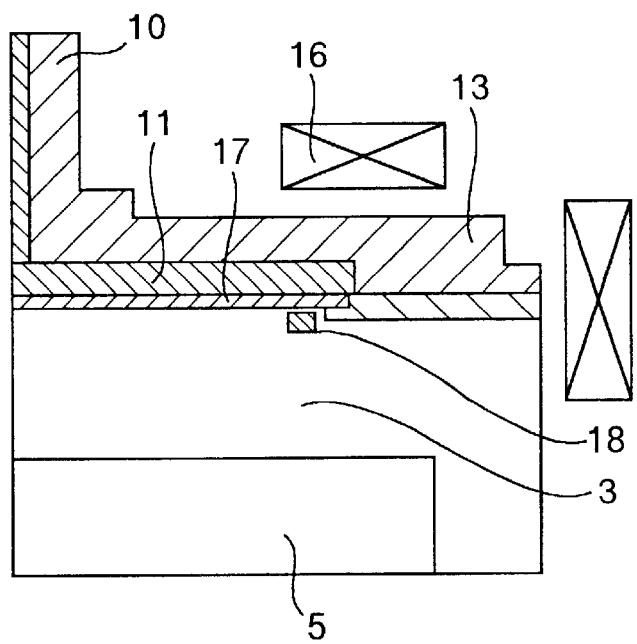
FIGS. 7A and 7B are diagrams useful in explaining operation and effect in the first embodiment of the invention.
Figure 7B:
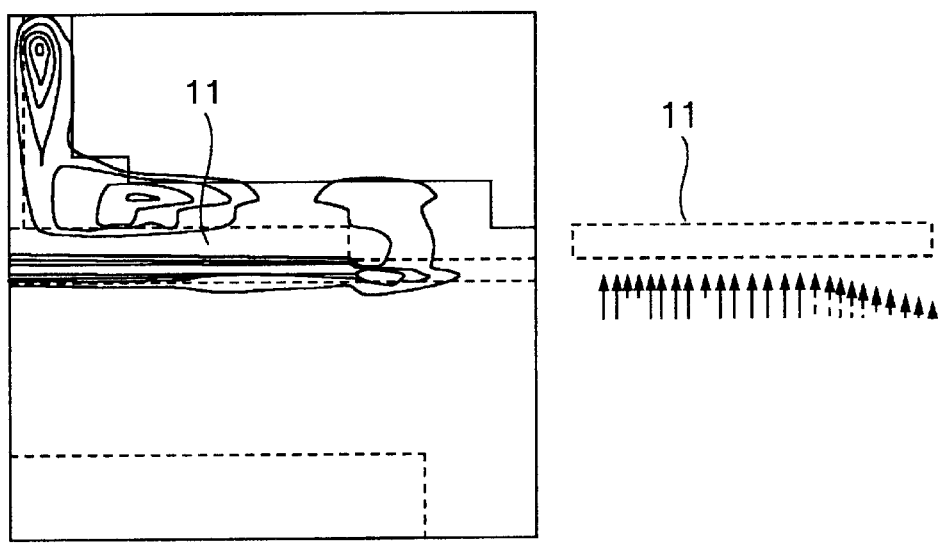
Figure 8A:
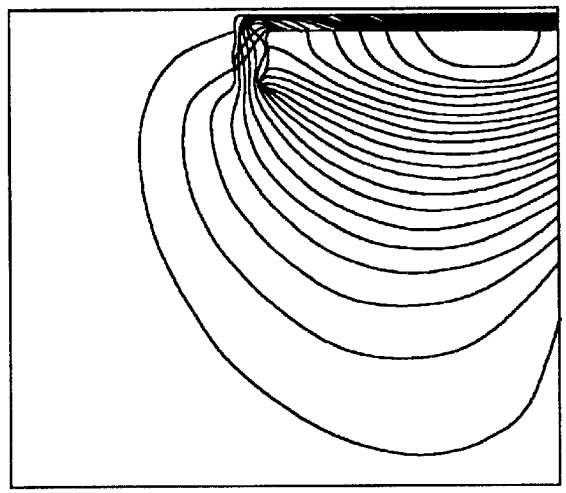
FIGS. 8A and 8B are diagrams useful in explaining operation and effect in the first embodiment of the invention.
Figure 8B:
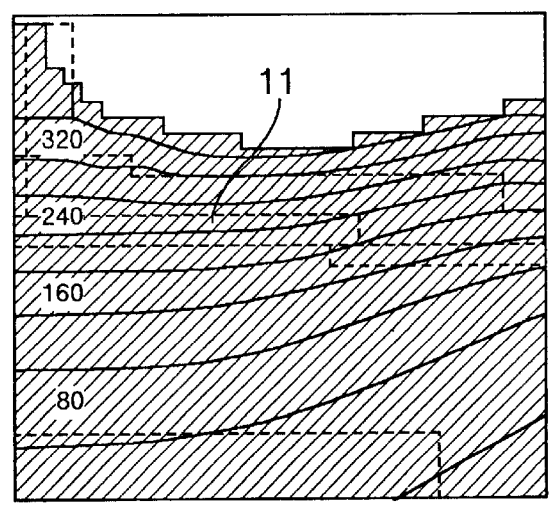
Figure 9A:
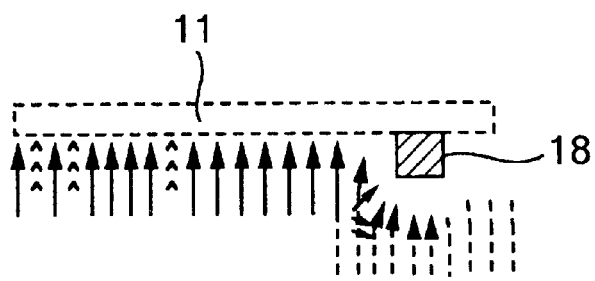
FIGS. 9A and 9B are diagrams useful in explaining operation and effect in the first embodiment of the invention.
Figure 9B:
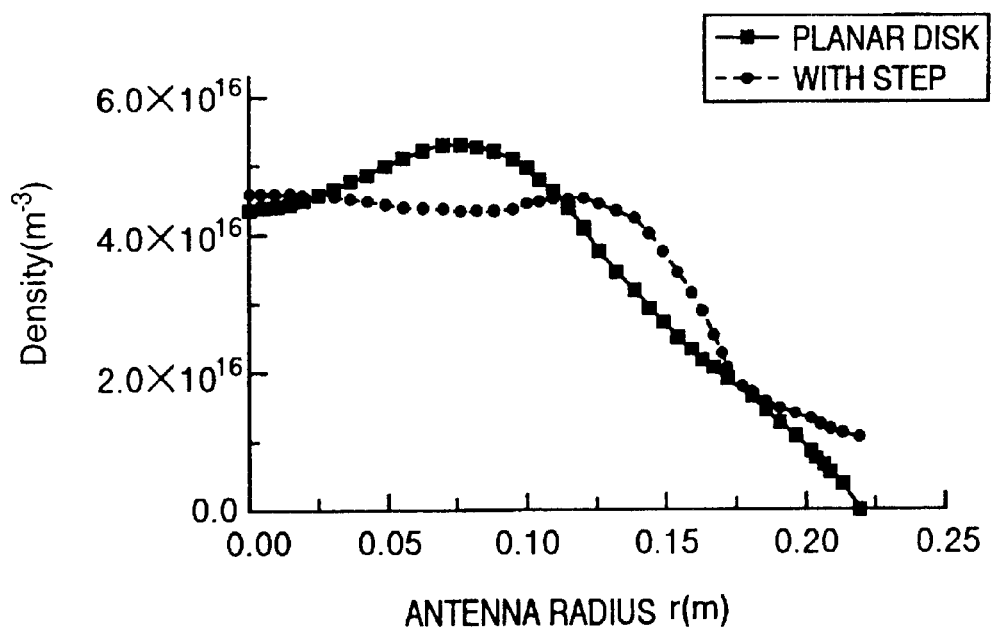

Referring to FIGS. 7A and 7B, FIGS. 8A and 8B and FIGS. 9A and 9B, a mechanism for unifying plasma by using the aforementioned groove or step 18 will be described by way of example of a UHF frequency of 450 MHz. FIG. 7A diagrammatically shows UHF-ECR (electron cyclotron resonance). To explain the vertical line on left end side of each drawing in FIGS. 7A and 7B and FIGS. 8A and 8B, this line corresponds to the center axis of UHF-ECR and the reduction scale is substantially the same throughout the individual figures. A UHF electric field propagates in a sheath formed between plasma and the antenna. As a representative example, a disk-shaped antenna having a radius of 150 mm will be described. FIG. 7B shows electric field distribution and electric field vectors directly below the antenna in the absence of the groove or step 18. More particularly, in the absence of the groove or step 18, the electric field distribution directly below the antenna has only z-direction component excepting for components at the edge portion, exhibiting convex distribution (Bessel function) in which the central portion is high, a node takes place at a position of ¼ λ, where λ is a wavelength in waveguide and in this instance, the position is at 110 mm near the radius, and the value of distribution is rendered to be zero at the edge of the electrode. As a result, in the absence of an external magnetic field to be described below, the plasma density becomes low and non-uniform at a position of r=110 mm near the antenna radius or disk radius. When a diverging magnetic field as shown in FIGS. 8A and 8B, in which the field intensity B is large in the center and decreases toward the periphery, is used as the external magnetic field, absorption power P=σEE* to plasma, where E is electric field intensity, E* is complex conjugate electric field intensity and σ is electric conductivity, is maximized near a position of r=60 mm that is distant from the center of disk-shaped antenna. Consequently, the plasma distribution has a peak near r=60 mm. The reason for this is that P is determined by the absolute value |E| of the electric field and the magnitude |E×B| of a vector product of E and B and hence, |E×B|=0 stands near the center because the electric field intensity |E| is high but E and B are parallel to each other and |E≈0 stands at the antenna edge to make both the |E| and |E×B| small. On the other hand, when, as an example of the invention, a ring having a height of 10 mm and a width of 10 mm is mounted to the disk-shaped antenna at a position of r=100 mm to provide a step, electric field distribution as shown in FIG. 9A is obtained. With this distribution, plasma is formed in conformity with the shape of the antenna and redirection components Er are formed at the step set up by the ring. As a result, the value E×B indicative of interaction of the electric field with the external magnetic field increases and plasma generation increases at that portion. As shown in FIG. 9B, the plasma density on the electrode is flattened as indicated by plasma distribution that is flattened outside r=100 mm owing to the step.

Figure 10:
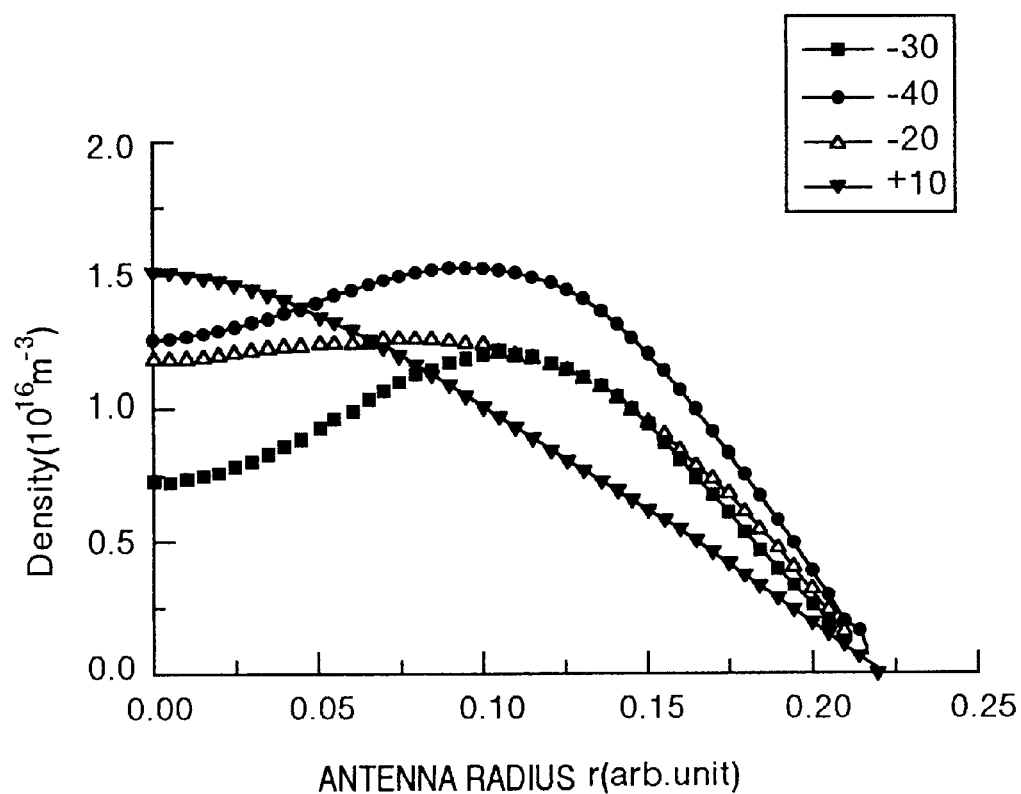
FIG. 10 is a graph for explaining results of calculation conducted with reference examples.

Next, a position where the groove or step 18 must be arranged will be described. Referring to FIG. 10, reference examples are given to show the relation between magnetic field coordination and plasma distribution obtained when a disk-shaped antenna removed of the groove or step 18 is used. Here, the electron cyclotron frequency corresponding to the 450 Mz frequency is 160 Gauss, this position is set as an ECR position to provide one index and the distance from the antenna is indicated as a parameter. The ECR position having plus sign is so defined as being above the antenna, that is, outside the processing chamber and the ECR position having minus sign is so defined as being under the antenna, that is, inside the processing chamber. It will be seen that the distribution changes depending on the ECR position. For example, when the ECR position is −30 mm, there results distribution in which the plasma density in the center is depressed. In this case, in order to make the plasma uniform, the step 18 is formed in the center of the disk-shaped antenna. For example, a ring having an inner radius of 20 mm and an outer radius of 30 mm is arranged, so that Er (radial component of electric field) can be generated inside the ring to generate plasma by interaction of Er with z component Bz of the external magnetic field. When the ECR position is +10 mm, the plasma density is low at the periphery and therefore, the groove or step 18 is formed at the antenna periphery as described above, for example, at r=110 mm to increase the plasma density at that portion.

The depth or width of the groove or step 18 is so determined as to allow plasma to intrude into a space formed by the groove or step can be longer than a sheath length for the plasma density concerned. Specifically, the depth or width is preferably at least about 1 mm or more and smaller than ¼ of wavelength of the radio frequency. Further, it is preferably about 1 cm or more. The position of the groove or step 18 differs depending on the used magnetic field coordination as described above but any position where an electric field orthogonal to the external magnetic field can be generated can suffice. In the foregoing, the frequency is described as being 450 MHz but since the electric field distribution is determined definitely by the frequency, the arrangement of the groove or step is determined spontaneously by a frequency in use. A plurality of grooves or steps 18 may be provided.

FIGS. 2A and 2B show a second embodiment of the invention. The construction of the electrode and antenna used in the plasma processing apparatus is noticed in the present embodiment. The present embodiment features that in the embodiment described in connection with FIGS. 1A and 1B, the disk-shaped antenna has a conical recess 19a (FIG. 2A) or a conical boss 19b (FIG. 2B) formed in the center of its surface adjoining plasma. The size of the recess or boss conforms to that described in connection with the first embodiment. Er component of electric field is generated in the center by means of the recess 19a or boss 19b. This component interacts with external magnetic field Bz, so that electron cyclotron resonance heating is effected also in the center to raise plasma density in the center (normally, the external magnetic field is axially symmetrical to have only Bz component in the center where r=0 and in the absence of the conical recess or boss, E×B=0 results).

Referring to FIG. 3, there is illustrated a third embodiment of the invention. The construction of the electrode and antenna used in the plasma processing apparatus is noticed in the present embodiment. The present embodiment features that in the embodiments described in connection with FIGS. 1A and 1B and FIGS. 2A and 2B, the surface of electrode or antenna adjoining plasma is made of a material of Si or SiC, or C and a member 20 constituting the groove or step 18 or the recess 19a or boss 19b is made of the same material as that of the antenna.

As described above, in order to cause the UHF electric field to change locally, the member made of Si or SiC, or C is required to act as an electrical conductor and to this end, the thickness of the member is required to be sufficiently larger than a skin depth of UHF. In case the 450 MHz frequency is used, a member material Si having a resistivity of 0.1 Ωcm or less may be used to meet equivalency to a laid electrical conductor. The material Si or SiC, or C plays the role of controlling F concentration in plasma.

Figure 4B:
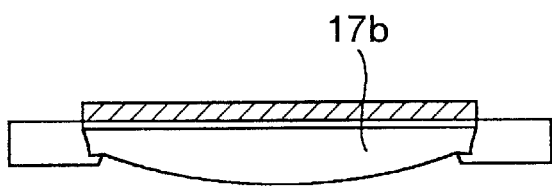

Referring to FIGS. 4A and 4B, a fourth embodiment of the invention will be described. The present embodiment features that the disk-shaped antenna used in the plasma processing apparatus is curved downward concavely as shown at 17a in FIG. 4A or downward convexly as shown at 17b in FIG. 4B at a constant curvature, with the result that the antenna surface adjoining plasma is not planar. Preferably, the antenna surface is made of Si or SiC, or C.

Figure 5A:
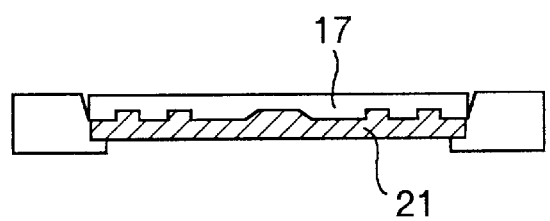
FIGS. 5A and 5B are diagrams showing in sectional form an antenna structure according to a fifth embodiment of the invention.
Figure 5B:
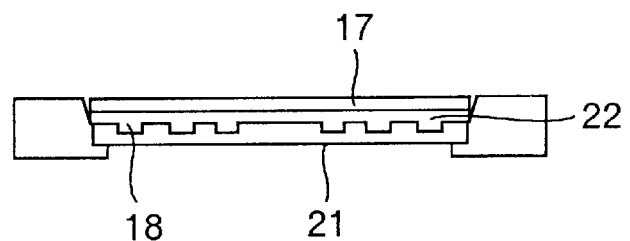

Referring to FIGS. 5A and 5B, a fifth embodiment of the invention will be described. The present embodiment features that a groove or step 18 or a conical recess 19a or boss 19b is formed in the surface of the disk-shaped antenna 17, a planar member 21 made of Si or SiC, or C is arranged on the surface to adjoin the processing chamber 3, and the UHF or VHF radio frequency is supplied to the processing chamber 3 through the planar member 21. A planar member of Si or SiC, or C having a thickness smaller than a skin depth determined by the frequency and resistivity is used. For example, given that the member is made of Si and the frequency of radio frequency wave is 450 MHz, a material of Si having a resistivity of 1 to 100 Ωcm and a thickness of about 10 mm is preferably used. With this construction, r component Er of electric field generated by unevenness in the surface of the disk-shaped antenna 17 penetrates into the processing chamber and interacts with a magnetic field at that portion, with the result that the distribution of absorption power to plasma, that is, the plasma distribution changes locally as described previously. As means for adjusting the electric field intensity, a waveguide path 22 formed of a dielectric or a gap may be interposed between the disk-shaped antenna 17 and the planar member 21.

Referring to FIGS. 6A and 6B, a sixth embodiment of the invention will be described. The present embodiment contemplates the construction of the electrode and antenna used in the plasma processing apparatus. Slit openings 23 are formed in a disk-shaped antenna 17 connected to an electrode 11, a planar member 21 made of Si or SiC, or C is arranged on the surface of antenna 17 opposing the processing chamber 3, and a radio frequency in UHF or VHF band is supplied to the processing chamber 3 through the planar member 21. The slit openings 23 may be formed at locations where the direction of a radio frequency electric field must be changed. The electric field is allowed to have only a component vertical to the conductor and therefore, it has only Ez component of RF electric field when the disk-shaped antenna 17 removed of slits is used. But with the slits formed, radial component Er of electric field is resultingly generated. Since the electric field interacts with the external magnetic field to establish E×B≠0 at the slit openings, plasma is generated there. In order to increase the plasma density at a peripheral position of r>100 mm distant from the center of the disk-shaped antenna in the case of the original convex plasma distribution described above, slit openings each having a width of 10 mm may be formed at a position of r=120 mm. With a view to maintaining the axial symmetry, slits are formed at a plurality of concentric and circumferential locations. If the electric field at the slit opening is desired to be intensified, the length of the slit opening may be integer times ½ λ, where λ is a wavelength in waveguide. When a dielectric (of specific inductivity $\epsilon_r$) serving as a filler is used for the slit opening, $\lambda = c/f/(\epsilon_r)^{1/2}$ stands, where c is velocity of light, and in an instance in which the filler is made of quartz having a specific inductivity $\epsilon_r$ of 3.5 and the frequency f is 450 MHz, λ/2≈18 cm stands and three slit openings each having a length (arc) of 18 cm may be formed circumferentially at a position of r=120 mm (corresponding to 754 mm circumference) to obtain high efficiency (FIG. 6A). Further for generation of a more intensified electric field, the dielectric constant of the dielectric on the back of the antenna and the size of the waveguide path may be changed in order that the slit openings are formed at positions corresponding to the maximum amplitude of the electric field. In the above case, a dielectric of quartz may be used on the back of the antenna.

With the aim of intensifying the electric field in the center and at the periphery, a plurality of slit openings may be formed radially and circumferentially as shown in, for example, FIG. 6B.

In the embodiments of the invention constructed as above, the surface of the disk-shaped antenna is made to be uneven to change the thickness of the electrode and the thickness of the waveguide path (inclusive of the member made of Si, SiC or C) in the radial direction, so that 1) the distribution of electric field intensity in the radial direction can be changed and 2) the direction of the electric field can be changed by the unevenness, that is, the angle included by E and B can be changed to change the distribution of power P=JE supplied to plasma, thereby making it possible to widen the control range of the plasma distribution. By using the electric field control means and the magnetic field generating means in combination, the plasma distribution can be controlled in compliance with changes in process parameters such as pressure, the kind of gas and power.

As described above, in the method of generating plasma by using the radio frequency in VHF or UHF band and the magnetic field, the plasma processing apparatus can be provided which can realize the generation of plasma of high density and high uniformity in a wide parameter region.

What is claimed is:

1. A plasma processing apparatus comprising a vacuum vessel, a processing chamber arranged in said vacuum vessel and supplied with gas, a support electrode arranged in said processing chamber to support an object to be processed, radio frequency providing means for supplying a radio frequency in UHF or VHF band to said processing chamber, and magnetic field generating means for generating a magnetic field in said processing chamber, said radio frequency providing means comprising an antenna having a groove or a step on its surface which is opposite to said object to be processed, the groove or step having a width that is not greater than 1/4 of the wavelength of the supplied radio frequency.

2. A plasma processing apparatus according to claim 1, wherein said antenna has a conical recess or boss in the center of its surface adjoining plasma.

3. A plasma processing apparatus according to claim 2, wherein said recess or boss is sized to have a thickness larger than a plasma sheath and smaller than ¼ of wavelength of the radio frequency.

4. A plasma processing apparatus according to claim 2, wherein the surface of said antenna is made of Si, SiC or C and said groove, step, recess or boss is made of the same material as that of the surface of said antenna.

5. A plasma processing apparatus according to claim 1, wherein said antenna takes a form curved downward concavely or convexly at a constant curvature.

6. A plasma processing apparatus according to claim 1, wherein a planar member made of Si, SiC or C is arranged on the surface of said antenna, said planar member has an effective thickness smaller than a skin depth of the radio frequency in UHF or VHF band to permit the radio frequency to be provided to said processing chamber through said planar member.

7. A plasma processing apparatus according to claim 1, wherein said antenna has slit openings and has on its surface adjoining said processing chamber a planar member made of Si, SiC or C, and the radio frequency in UHF or VHF band is supplied to said processing chamber through said planar member.

8. A plasma processing apparatus according to claim 1, wherein the groove or step on the surface of said antenna is at least one of a recess and boss.

9. A plasma processing apparatus according to claim 8, wherein the at least one of the recess and boss is provided proximate to a center of the surface of the antenna.

10. A plasma processing apparatus according to claim 8, wherein the at least one of the recess and boss is configured to have a thickness larger than a plasma sheath and smaller than ¼ of a wavelength of the radio frequency.

11. A plasma processing apparatus according to claim 8, wherein the surface of the antenna is formed of at least one of Si, SiC and C, and the at least one of the recess and boss is formed of the same material as the material of the surface of said antenna.

12. A plasma processing apparatus according to claim 8, wherein the radio frequency in the UHF or VHF band has a wavelength of at least 30 MHz.

13. A plasma processing apparatus comprising a vacuum vessel, a processing chamber arranged in said vacuum vessel and supplied with gas, a support electrode arranged in said processing chamber to support an object to be processed, radio frequency providing means for supplying a radio frequency in at least one of a UHF and a VHF band to said processing chamber, a magnetic field generating means for generating a magnetic field in said processing chamber, said radio frequency providing means comprising an antenna having at least one of a groove and a step on a surface thereof which opposes the object to be processed so as to enable a uniform plasma distribution over the object to be processed in a plasma generated based on a surface wave propagated from said antenna, the groove or step having a width that is not greater than 1/4 of the wavelength of the supplied radio frequency.

14. A plasma processing apparatus according to claim 13, wherein the groove or step on the surface of said antenna is at least one of a recess and boss.

15. A plasma processing apparatus according to claim 14, wherein the at least one of the recess and boss is provided proximate to a center of the surface of the antenna.

16. A plasma processing apparatus according to claim 14, wherein the at least one of the recess and boss is configured to have a thickness larger than a plasma sheath and smaller than ¼ of a wavelength of the radio frequency.

17. A plasma processing apparatus according to claim 14, wherein the surface of the antenna is formed of at least one of Si, SiC and C, and the at least one of the recess and boss is formed of the same material as the material of the surface of said antenna.

18. A plasma processing apparatus according to claim 14, wherein the radio frequency in the UHF or VHF band has a wavelength of at least 30 MHz.

19. A plasma processing apparatus according to claim 1, wherein the width of the groove or step is at least 1 mm and not greater than ¼ of the wavelength of the supplied radio frequency.

20. A plasma processing apparatus according to claim 1, wherein the width of the groove or step is at least 1 cm and not greater than ¼ of the wavelength of the supplied radio frequency.

21. A plasma processing apparatus according to claim 1, wherein a plasma is generated in said processing chamber between said antenna and said object to be processed, and the groove or step is located in the surface of said antenna which is one of adjoining and non-adjoining the plasma.

22. A plasma processing apparatus according to claim 13, wherein the width of the groove or step is at least 1 mm and not greater than ¼ of the wavelength of the supplied radio frequency.

23. A plasma processing apparatus according to claim 13, wherein the width of the groove or step is at least 1 cm and not greater than ¼ of the wavelength of the radio frequency.

24. A plasma processing apparatus according to claim 13, wherein the plasma is generated in said processing chamber between said antenna and said object to be processed, and the groove or step is located in the surface of said antenna which is one of adjoining and non-adjoining the plasma.

* * * * *